(12) United States Patent
Yang

(10) Patent No.: US 11,892,502 B2
(45) Date of Patent: Feb. 6, 2024

(54) THROUGH-SILICON VIA (TSV) FAULT-TOLERANT CIRCUIT, METHOD FOR TSV FAULT-TOLERANCE AND INTEGRATED CIRCUIT (IC)

(71) Applicant: Changxin Memory Technologies, Inc., Anhui (CN)

(72) Inventor: Cheng-Jer Yang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 478 days.

(21) Appl. No.: 17/165,797

(22) Filed: Feb. 2, 2021

(65) Prior Publication Data

US 2021/0156908 A1 May 27, 2021

Related U.S. Application Data

(63) Continuation of application No. PCT/CN2019/102800, filed on Aug. 27, 2019.

(30) Foreign Application Priority Data

Aug. 31, 2018 (CN) .......................... 201811012348.7
Aug. 31, 2018 (CN) .......................... 201821427928.8

(51) Int. Cl.
| | |
|---|---|
| *G01R 31/28* | (2006.01) |
| *H01L 23/48* | (2006.01) |
| *H01L 25/065* | (2023.01) |

(52) U.S. Cl.
CPC ........ *G01R 31/2884* (2013.01); *H01L 23/481* (2013.01); *H01L 25/0657* (2013.01); *H01L 2225/06541* (2013.01)

(58) Field of Classification Search
CPC .............. G01R 31/2884; H01L 23/481; H01L 25/0657; H01L 2225/06541; H01L 22/22; G06F 11/261; G06F 30/33; G11C 29/40

(Continued)

(56) References Cited

U.S. PATENT DOCUMENTS

| | | |
|---|---|---|
| 7,897,503 B2 | 3/2011 | Foster et al. |
| 9,177,940 B2 | 11/2015 | Lung et al. |

(Continued)

FOREIGN PATENT DOCUMENTS

| | | |
|---|---|---|
| CN | 102709272 A | 10/2012 |
| CN | 103780243 A | 5/2014 |

(Continued)

OTHER PUBLICATIONS

PCT International Search Report and the Written Opinion dated Nov. 28, 2019, issued in related International Application No. PCT/CN2019/102800 (7 pages).

(Continued)

*Primary Examiner* — Lee E Rodak
*Assistant Examiner* — Trung Q Nguyen
(74) *Attorney, Agent, or Firm* — Sheppard Mullin Richter & Hampton LLP

(57) ABSTRACT

An integrated circuit with a through-silicon via (TSV) fault-tolerant circuit, a TSV fault tolerance method are disclosed. The IC may include a plurality of operational TSVs, a spare TSV, a plurality of fault-tolerance control modules each coupled to one of the plurality of operational TSVs and the spare TSV, and a decoder coupled to the fault-tolerance control modules. The fault-tolerance control modules may be configured to deactivate an operational TSV that is determined to be defective and activate the spare TSV based on a positioning code for the defective operational TSV from the decoder. The IC may reduce the defect rate in the fabrication of TSV-based three-dimensional (3D) IC chips.

14 Claims, 11 Drawing Sheets

(58) Field of Classification Search
USPC ......... 324/600, 500, 762.03–762.06, 763.01, 324/750.22, 207.13
See application file for complete search history.

(56) References Cited

U.S. PATENT DOCUMENTS

| | | |
|---|---|---|
| 9,304,167 B2 | 4/2016 | Hwang et al. |
| 9,401,312 B1 | 7/2016 | Kannan et al. |
| 10,224,115 B2 | 3/2019 | Yang et al. |
| 2009/0212407 A1 | 8/2009 | Foster et al. |
| 2011/0050320 A1* | 3/2011 | Gillingham ............. H01L 21/82 |
| | | 327/365 |
| 2012/0248438 A1 | 10/2012 | Lung et al. |
| 2015/0179285 A1* | 6/2015 | Kilmer ................ H01L 25/0657 |
| | | 365/200 |
| 2015/0185274 A1 | 7/2015 | Hwang et al. |

FOREIGN PATENT DOCUMENTS

| | | |
|---|---|---|
| CN | 103999162 A | 8/2014 |
| CN | 104900644 A | 9/2015 |
| CN | 106252331 A | 12/2016 |
| CN | 109037192 A | 12/2018 |
| CN | 208655629 U | 3/2019 |

OTHER PUBLICATIONS

First Search dated Jun. 25, 2023, issued in related Chinese Application No. 201811012348.7, with English machine translation (5 pages).

* cited by examiner

THROUGH-SILICON VIA (TSV) FAULT-TOLERANT CIRCUIT, METHOD FOR TSV FAULT-TOLERANCE AND INTEGRATED CIRCUIT (IC)

CROSS-REFERENCE TO RELATED APPLICATIONS

This application is a continuation application of International Patent Application No. PCT/CN2019/102800, filed on Aug. 27, 2019, which is based on and claims priority of the Chinese Patent Applications No. 201811012348.7 and No. 201821427928.8, both filed on Aug. 31, 2018. The above-referenced applications are incorporated herein by reference in their entirety.

TECHNICAL FIELD

This disclosure generally relates to the field of integrated circuits (ICs), and more specifically, to ICs with a through-silicon via (TSV) fault-tolerant circuit, and a TSV fault tolerance method.

BACKGROUND

After decades of rapid development in accordance to Moore's Law, the semiconductor IC technology is facing severe barriers in terms of component size, function enhancement, cost-reduction, etc. To break through these physical and material barriers, three-dimensional (3D) IC technology has been developed.

3D ICs are based on through-silicon vias (TSVs) which interconnect and integrate multiple vertically-stacked tiers of chips. Compared to long interconnects used in traditional planar ICs, TSVs are much shorter and thus offer a variety of advantages, such as lower latency, lower power consumption, higher performance, which make TSV-based 3D ICs attractive for various applications.

However, due to the limitations in existing processes and materials, defective or malfunctioning TSVs may result from the fabrication and bonding of TSVs in 3D ICs, and even one single defective TSV may cause the entire 3D IC not be able to function as designed. Unfortunately, so far there has been no satisfactory solution to efficiently resolve the issue of defective TSVs.

It is to be noted that the above information disclosed in this Background section is only for the understanding of the background of the invention and therefore may contain information that does not form the prior art already known to a person of ordinary skill in the art.

SUMMARY

In view of the limitations of existing technologies described above, this disclosure provides an IC with a TSV fault-tolerant circuit, and a TSV fault tolerance method that address at least some of the aforementioned limitations.

One aspect of this inventive concept is directed to an IC with a plurality of TSV fault-tolerant circuit. The IC may include a plurality of operational TSVs, a spare TSV, a plurality of fault-tolerance control modules each coupled to one of the plurality of operational TSVs and the spare TSV, and a decoder coupled to the plurality of fault-tolerance control modules. The plurality of fault-tolerance control modules may be configured to deactivate one of the plurality of operational TSVs that is determined to be defective and activate the spare TSV based on a positioning code for the defective operational TSV from the decoder.

In some embodiments, each of the plurality of fault-tolerance control modules may include an input control unit coupled to an input of one of the plurality of operational TSVs and an input of the spare TSV. The input control unit may be configured to deactivate the operational TSV that is determined to be defective and activate the spare TSV based on the positioning code for the defective operational TSV from the decoder.

In some embodiments, the input control unit may include a first transistor, a second transistor and a first inverter. The first transistor may be configured to deactivate the operational TSV that is determined to be defective based on the positioning code for the defective operational TSV from the decoder, the second transistor and the first inverter may be configured to activate the spare TSV based on the positioning code for the defective operational TSV from the decoder.

In some embodiments, each of the first transistor and the second transistor may include a control terminal, a first terminal and a second terminal, and the first inverter may include a first terminal and a second terminal. The control terminal of the first transistor may be coupled to an output of the decoder, the first terminal of the first transistor may be configured to receive a signal intended to be input to the operational TSV, the second terminal of the first transistor may be coupled to the input of the operational TSV. The first terminal of the first inverter may be coupled to the output of the decoder, the second terminal of the first inverter may be coupled to the control terminal of the second transistor. The first terminal of the second transistor may be configured to receive the signal intended to be input to the operational TSV, and the second terminal of the second transistor may be coupled to the input of the spare TSV.

In some embodiments, the input control unit may include a first transistor, a second transistor, a first inverter and a first spare transistor. The first transistor may be configured to deactivate the operational TSV that is determined to be defective based on the positioning code for the defective operational TSV from the decoder. The first spare transistor may be configured to activate the spare TSV based on a positioning code for the spare TSV from the decoder, and the second transistor and the first inverter may be configured to feed a signal intended to be input to the operational TSV that is determined to be defective to the input of the spare TSV based on the positioning code for the defective operational TSV from the decoder.

In some embodiments, each of the first transistor, the second transistor and the first spare transistor may include a control terminal, a first terminal and a second terminal, and the first inverter may include a first terminal and a second terminal. The control terminal of the first transistor may be coupled to a first output of the decoder, the first terminal of the first transistor may be configured to receive a signal intended to be input to the operational TSV, the second terminal of the first transistor may be coupled to the input of the operational TSV. The first terminal of the first inverter may be coupled to the first output of the decoder, the second terminal of the first inverter may be coupled to the control terminal of the second transistor. The first terminal of the second transistor may be configured to receive the signal intended to be input to the operational TSV, the second terminal of the second transistor may be coupled to the first terminal of the first spare transistor. The control terminal of the first spare transistor may be coupled to a second output of the decoder, and the second terminal of the first spare transistor may be coupled to the input of the spare TSV.

In some embodiments, each of the plurality of fault-tolerance control modules may further include an output control unit coupled to an output of the operational TSV and an output of the spare TSV. The output control unit may be configured to feed an output signal from the spare TSV to the output of the operational TSV that is determined to be defective based on the positioning code for the operational TSV from the decoder.

In some embodiments, the output control unit may include a third transistor and a second inverter. The third transistor may include a control terminal, a first terminal and a second terminal. The second inverter may include a first terminal and a second terminal. The first terminal of the second inverter may be coupled to an output of the decoder, the second terminal of the second inverter may be coupled to the control terminal of the third transistor. The first terminal of the third transistor may be coupled to the output of the spare TSV, and the second terminal of the third transistor may be coupled to the output of the operational TSV.

In some embodiments, the output control unit may include a third transistor, a second inverter and a second spare transistor. Each of the third transistor and the second spare transistor may include a control terminal, a first terminal and a second terminal, and the second inverter may include a first terminal and a second terminal. The first terminal of the second inverter may be coupled to a first output of the decoder, the second terminal of the second inverter may be coupled to the control terminal of the third transistor. The first terminal of the third transistor may be coupled to the first terminal of the second spare transistor, the second terminal of the third transistor may be coupled to the output of the operational TSV. The control terminal of the second spare transistor may be coupled to a second output of the decoder, and the second terminal of the second spare transistor may be coupled to the output of the spare TSV.

In some embodiments, the input control unit may include a first transmission gate, a second transmission gate and a third inverter. The first transmission gate may be configured to deactivate the operational TSV that is determined to be defective based on the positioning code for the defective operational TSV from the decoder, the second transmission gate and the third inverter may be configured to activate the spare TSV based on the positioning code for the defective operational TSV from the decoder.

In some embodiments, each of the first transmission gate and the second transmission gate may include a first control terminal, a second control terminal, an input and an output. The third inverter may include a first terminal and a second terminal. The first control terminal of the first transmission gate may be coupled to an output of the decoder. The second control terminal of the first transmission gate may be coupled to the second terminal of the third inverter, the input of the first transmission gate may be configured to receive a signal intended to be input to the operational TSV, the output of the first transmission gate may be coupled to the input of the operational TSV. The first terminal of the third inverter may be coupled to the output of the decoder, the second terminal of the third inverter may be coupled to the first control terminal of the second transmission gate. The second control terminal of the second transmission gate may be coupled to the output of the decoder, the input of the second transmission gate may be configured to receive the signal intended to be input to the defective operational TSV, and the output of the second transmission gate may be coupled to the input of the spare TSV.

In some embodiments, the output control unit may include a third transmission gate and a fourth inverter. The third transmission gate may include a first control terminal, a second control terminal, an input and an output. The fourth inverter may include a first terminal and a second terminal. The first terminal of the fourth inverter may be coupled to the output of the decoder, the second terminal of the fourth inverter may be coupled to the first control terminal of the third transmission gate. The second control terminal of the third transmission gate may be coupled to the output of the decoder, the input of the third transmission gate may be coupled to the output of the spare TSV, and the output of the third transmission gate may be coupled to the output of the operational TSV.

In some embodiments, the number of operational TSVs may be no less than 4.

In some embodiments, the number of operational TSVs may be 4, 8, 16, 32, or 64.

In some embodiments, the positioning code for the defective operational TSV may be 0, and a positioning code for a normal operational TSV may be 1.

According to some embodiments of this inventive concept, the IC with the TSV fault-tolerant circuit contains a plurality of operational TSVs and a spare TSV, the IC is capable of deactivating an operational TSV that is determined to be defective and accordingly activating the spare TSV, as required, based on a positioning code for the defective operational TSV from the decoder. Specifically, upon the detection of the failure or malfunctioning of an operational TSV, the defective operational TSV can be deactivated, and the spare TSV can be activated to pass a signal originally intended to be transmitted through the defective operational TSV, thereby achieving TSV fault tolerance. This IC can reduce the defect rate in the fabrication of TSV-based 3D IC chips.

It is to be understood that both the foregoing general description and the following detailed description are exemplary and explanatory only and are not restrictive of this inventive concept.

BRIEF DESCRIPTION OF THE DRAWINGS

The accompanying drawings, which are incorporated in and constitute a part of the description, illustrate embodiments consistent with the present invention and, together with the description, serve to explain the disclosed principles. It is apparent that these drawings present only some embodiments of the present invention and those of ordinary skill in the art may obtain drawings of other embodiments from them without exerting any creative effort. In the figures.

DETAILED DESCRIPTION OF THE EMBODIMENTS

Figure 1:
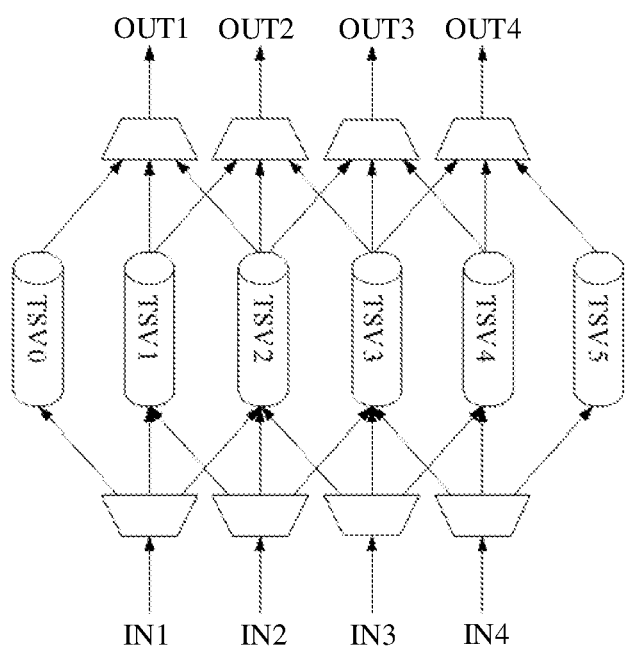
FIG. 1 shows a schematic illustration of a circuit for through-silicon via (TSV) fault-tolerance in accordance with some techniques.

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of this inventive concept and to fully convey the concepts of the embodiments to others skilled in the art. In addition, the described features, structures, and characteristics may be combined in any suitable manner in one or more embodiments. In view of this inventive concept herein, those skilled in the art will recognize that the various embodiments can be practiced without one or more of the specific details or with other methods, components, materials, or the like. In some instances, well-known structures, materials, or operations are not shown or not described in detail to avoid obscuring aspects of the embodiments.

Further, the drawings are presented to illustrate and exemplify the inventive concept and not necessarily drawn to scale. In the drawings, like reference numerals indicate the same or analogous elements, and duplicate detailed description thereof will thus be omitted.

FIG. 1 shows a schematic illustration of a circuit for through-silicon via (TSV) fault-tolerance in accordance with some techniques. Referring to FIG. 1, this TSV fault-tolerant circuit requires many redundant TSVs as spare TSVs and a number of selectors for passing a signal through a selected TSV. This circuit significantly increases the complexity and cost of an IC fabrication process.

In view of this, this inventive concept presents an integrated circuit (IC) with a TSV fault-tolerant circuit. The IC may include an active TSV, a spare TSV, a fault-tolerance control module and a decoder. In some embodiments, the IC may include a plurality of active TSVs. In some embodiments, the IC may include a plurality of fault-tolerance control modules each corresponding to one of the plurality of active TSVs and the spare TSV.

The active TSV may be an operational TSV that, when working properly, transmits a signal, and the spare TSV may be configured to, upon the failure or malfunctioning of the active TSV, transmit the signal in lieu of the defective active TSV. In addition, the spare TSV may also be activated for any purpose other than replacing the abnormal/defective active TSV, and this inventive concept is not limited in this regard.

The fault-tolerance control module may be coupled to the active TSV and spare TSV, and may include a control element for determining whether a signal is to be passed to another tier via the active TSV and/or the spare TSV.

The decoder may be coupled to the fault-tolerance control module and configured to feed to the fault-tolerance control module a control signal corresponding to a TSV so as to allow the control element in the fault-tolerance control module to control the transmission of the signal.

Specifically, the decoder may incorporate logic elements for determining positioning codes for an individual TSV and the fault-tolerance control module may deactivate or activate the individual TSV based on control signals representative of such positioning codes. As used herein, the term "deactivating" a TSV may refer to disallowing the TSV to transmit a signal to any other tier, and the term "activating" a TSV may refer to allowing the TSV to transmit a signal to another tier. This inventive concept is not limited to any particular configuration of logics or elements in the decoder.

Figure 2:
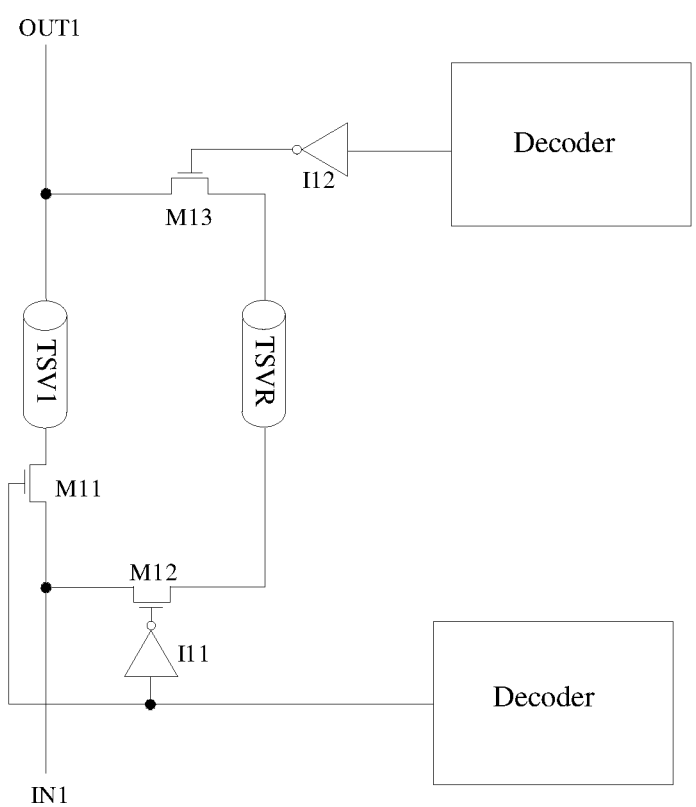
FIG. 2 shows an IC with a TSV fault-tolerant circuit in accordance with a first embodiment of this inventive concept.

An IC with a TSV fault-tolerant circuit in accordance with a first embodiment of this inventive concept will be described with reference to FIG. 2. As shown in FIG. 2, the IC with the TSV fault-tolerant circuit may include an active TSV (TSV1), a spare TSV (TSVR), a fault-tolerance control module and a decoder. The fault-tolerance control module may include a first transistor M11, a second transistor M12, a third transistor M13, a first inverter I11 and a second inverter I12.

It is to be understood that although two decoders are illustrated in FIG. 2 and the subsequent drawings, in practical constructions of the circuit, the two illustrated decoders may be implemented as a single decoder. In other words, the two illustrated decoders may output the same control signal, and the illustration is merely for facilitating explanation of this inventive concept. Alternatively, in actual applications, two decoders may be actually configured in the circuit, as shown in FIG. 2, and this inventive concept is not limited to these particular scenarios.

In addition, in the IC of FIG. 2, the decoder may be substituted with, for example, a selector or any other suitable devices capable of responding to a certain command to provide one TSV with a deactivating or activating instruction.

It is to be noted that, while the active TSV TSV1 and the spare TSV TSVR are shown in FIG. 2 as being directly adjacent to each other, this is merely an example, and in actual applications, there may be other structures or elements, such as other TSVs, interposed between the active TSV TSV1 and the spare TSV TSVR. This inventive concept is not limited in this regard.

The fault-tolerance control module may include an input control unit comprising the first transistor M11, the second transistor M12 and the first inverter I11. This input control unit may be coupled to the active TSV TSV1 and the spare TSV TSVR. For example, the first transistor M11 may be configured to deactivate the active TSV based on positioning information from the decoder, and a subunit constituted of the second transistor M12 and the first inverter I11 may be configured to transmit an input IN1 to the spare TSV TSVR upon the deactivation of the first transistor M11. That is, the second transistor M12 and the first inverter I11 may be configured to feed a signal intended to be input to the active TSV TSV1 to the input of the spare TSV TSVR based on positioning information from the decoder.

Specifically, the first transistor M11 may have a control terminal coupled to an output of the decoder, a first terminal for receiving the signal IN1 to be input to the active TSV TSV1, and a second terminal coupled to an input of the active TSV TSV1.

The first inverter I11 may include a first terminal coupled to the output of the decoder, a second terminal of the first inverter I11 may be coupled to a control terminal of the second transistor M12.

The second transistor M12 may have a first terminal for receiving the signal IN1 to be input to the active TSV TSV1, and the second terminal of the second transistor M12 may be coupled to an input of the spare TSV TSVR.

The fault-tolerance control module may further include an output control unit comprising the third transistor M13 and the second inverter I12. This output control unit may be coupled to an output of the active TSV TSV1 and an output of the spare TSV TSVR and configured to transmit a signal output from the spare TSV TSVR to the output of the active TSV TSV1 based on a positioning code for the active TSV TSV1 from the decoder.

Specifically, the second inverter I12 may have a first terminal coupled to the output of the decoder, and a second terminal of the second inverter I12 may be coupled to a control terminal of the third transistor M13.

The third transistor M13 may have a first terminal coupled to the output of the spare TSV TSVR, and a second terminal of the third transistor M13 may be coupled to the output of the active TSV TSV1.

For example, when an inspection circuit (not shown) detects that the active TSV TSV1 has failed, it will issue a command to the decoder, from which the decoder may determine a positioning code for the active TSV TSV1 and send a low-level signal to the active TSV TSV1 via its output coupled thereto. As a result, the first transistor M11 may be turned off, and at the same time, the second transistor M12 may be turned on under the action of the first inverter I11, switching the input signal IN1 to the spare TSV TSVR. Additionally, the decoder may also output a low-level signal through its output coupled to the first terminal of the second inverter I12, so the third transistor M13 may be turned on, allowing the signal that has propagated through the spare TSV TSVR, indicated at OUT1, to be provided at the output of the active TSV TSV1.

As can be readily seen from FIG. 2, when the active TSV TSV1 functions normally, the decoder will output high levels and no signal is allowed to pass through the spare TSV TSVR.

With the IC provided in the example of FIG. 2, fault-tolerance can be achieved for the TSVs, which may reduce the defect rate of three-dimensional (3D) integrated circuit (IC) chip fabrication.

Figure 3:
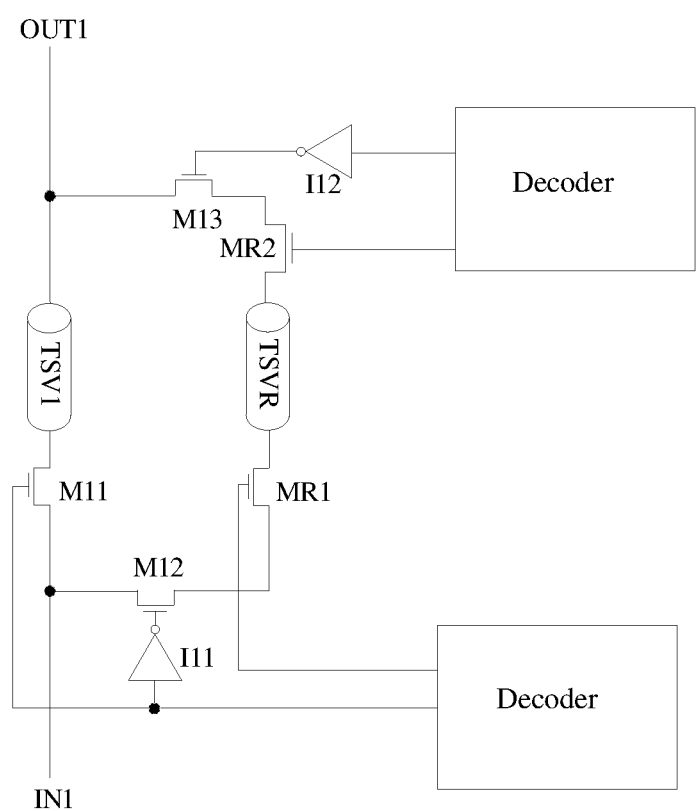
FIG. 3 shows an IC with a TSV fault-tolerant circuit in accordance with a second embodiment of this inventive concept.

FIG. 3 shows an IC with a TSV fault-tolerant circuit in accordance with a second embodiment of this inventive concept.

The IC of FIG. 3 differs from that of FIG. 2 in that a first spare transistor MR1 and a second spare transistor MR2 are provided at the input and output of the spare TSV TSVR, respectively. Additionally, in order for fault tolerance to be achieved for the TSVs, the control signals from the two outputs of the decoder are opposite in phase to each other. In other words, one of the signals is at a high level, and the other is at a low level. It will be readily appreciated by those skilled in the art that the two control signals opposite in phase to each other may be achieved by an inverter, but this embodiment is not particularly limited in this regard.

In the embodiment of FIG. 3, upon failure of the active TSV TSV1, the decoder may output a low-level signal (e.g., "0") to the control terminal of the first transistor M11 and thereby turn the first transistor M11 off. Additionally, under the effect of the low-level signal acting on the first inverter I11, the second transistor M12 may be turned on. As a result, one terminal of the first spare transistor MR1 may be made ready to receive a signal intended to be input to the active TSV TSV1. Meanwhile, the decoder may also output a high-level signal (e.g., "1") to the control terminal of the first spare transistor MR1, which may turn on the first spare transistor MR1. Consequently, the signal originally intended to be input to the active TSV TSV1 may be passed through the spare TSV TSVR.

Although FIGS. 2 and 3 illustrate examples each with only one active TSV, it is to be understood that, as noted above, this inventive concept also contemplates embodiments with more than one active TSV.

Figure 4:
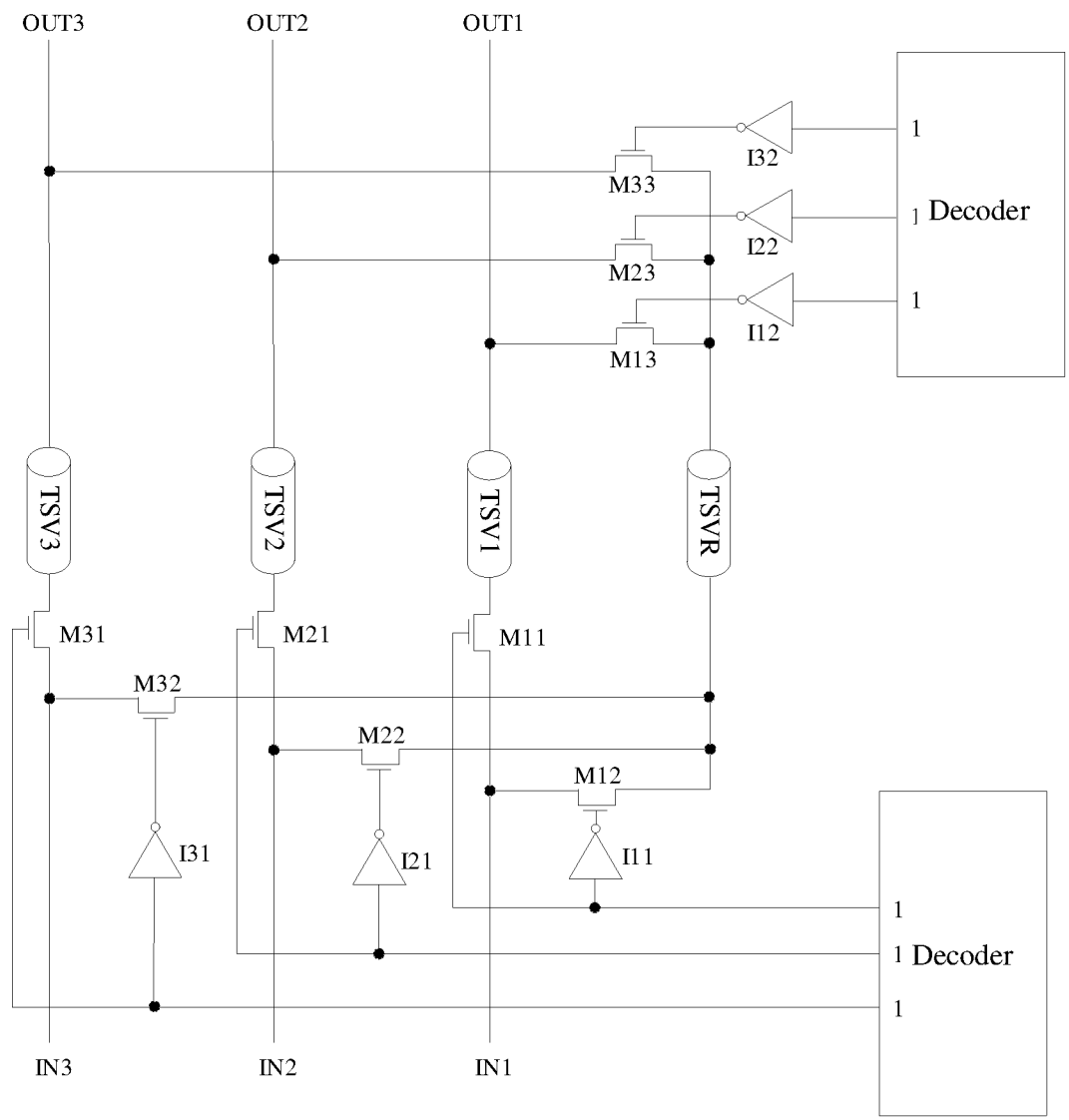
FIG. 4 shows an IC with a TSV fault-tolerant circuit in accordance with a third embodiment of this inventive concept.

FIG. 4 shows an IC with a TSV fault-tolerant circuit in accordance with a third embodiment of this inventive concept. As shown in FIG. 4, in addition to the aforementioned active TSV TSV1, the circuit may further include active TSVs TSV2 and TSV3. Moreover, each of the active TSVs TSV2 and TSV3 may be provided with a separate fault-tolerance control module (including an input control unit and an output control unit) with identical transistors and inverters. Relevant parts in the aforementioned embodiments may be referred to for the connections of these components, which will not be repeatedly described herein.

In the embodiment of FIG. 4, the decoder may be a 2-line-to-4-line decoder having three outputs respectively coupled to the fault-tolerance control modules of the active TSVs TSV1, TSV2 and TSV3 and a floating fourth output. In the illustrated example, each of the three outputs may output a high level 1 when the corresponding active TSV TSV1, TSV2 or TSV3 are working properly. Table 1 presents a truth table of the decoder of FIG. 4.

TABLE 1

| A | B | TSV1 | TSV2 | TSV3 |
|---|---|------|------|------|
| 0 | 0 | 1    | 1    | 0    |
| 0 | 1 | 1    | 0    | 1    |
| 1 | 0 | 0    | 1    | 1    |
| 1 | 1 | 1    | 1    | 1    |

In this table, A and B denote the two inputs (not shown) of the decoder, and the values of A and B may be received from an inspection circuit. Since any defective one of the active TSVs may be uniquely identified based on the A and B values, they may be considered as the aforementioned positioning code.

Figure 5:
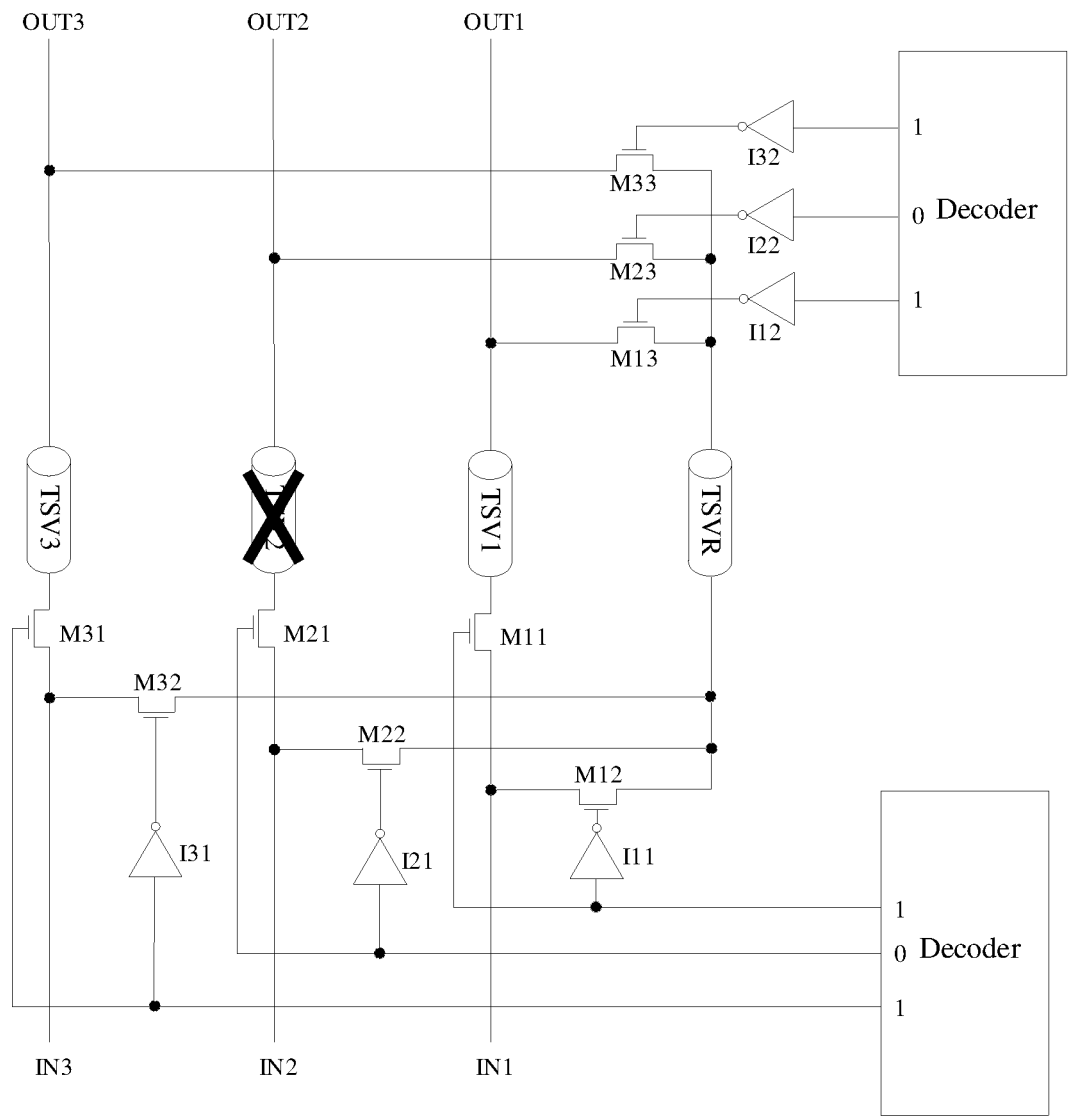
FIG. 5 shows an IC with a TSV fault-tolerant circuit in accordance with a fourth embodiment of this inventive concept.

FIG. 5 shows an IC with a TSV fault-tolerant circuit in accordance with a fourth embodiment of this inventive concept. FIG. 5 shows a scenario of the decoder of FIG. 4, where A=0 and B=1. In this case, a low-level signal is provided to a transistor M21 coupled to an input of the active TSV TSV2. As a result, the active TSV TSV2 may be deactivated, and an input IN2 originally intended to pass therethrough may be switched via a transistor M22 to the spare TSV TSVR. After it is output from this spare TSV TSVR as a signal, indicated at OUT2, it may be further fed via a transistor M23 to an output of the active TSV TSV2.

Figure 6:
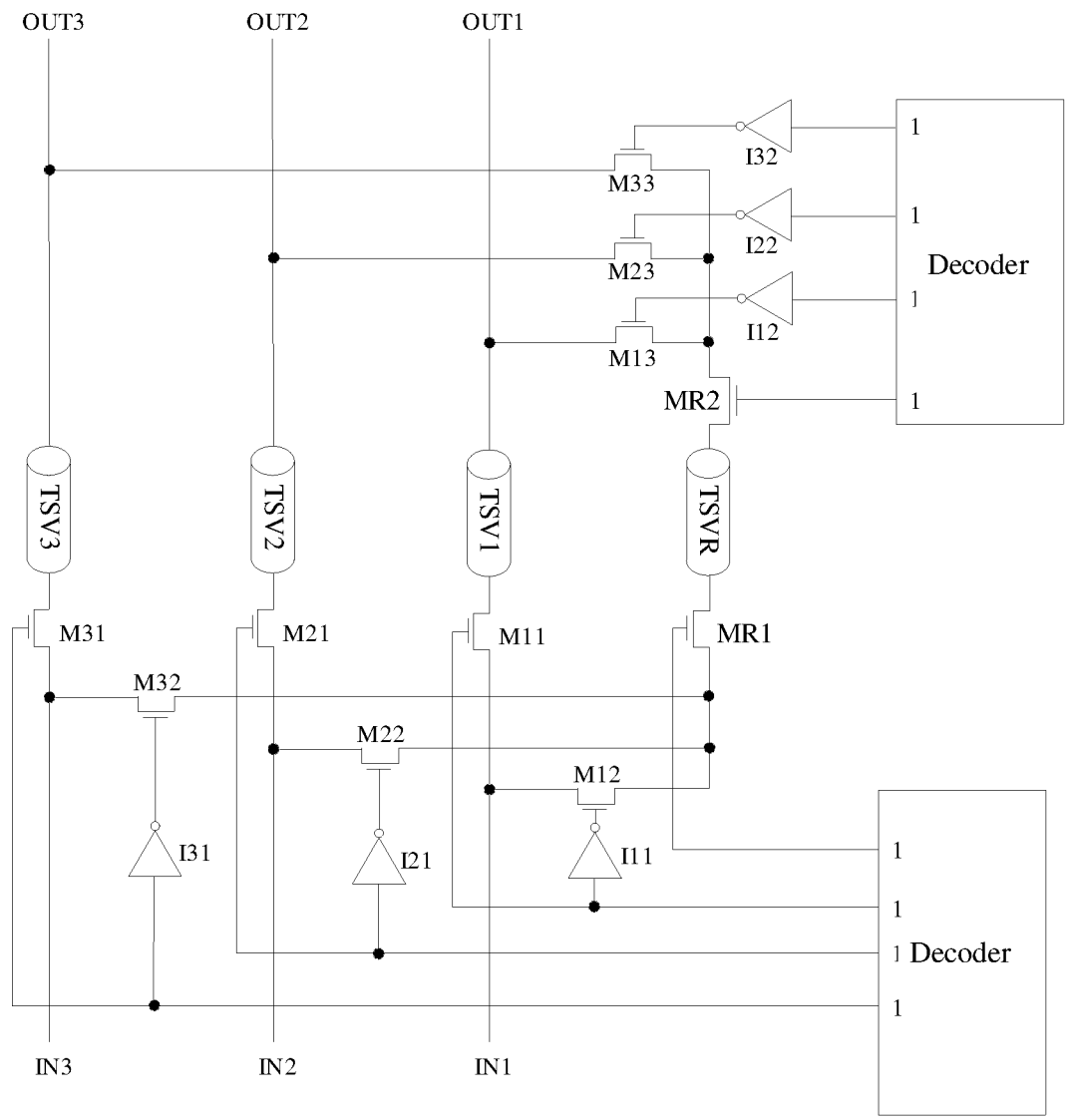
FIG. 6 shows an IC with a TSV fault-tolerant circuit in accordance with a fifth embodiment of this inventive concept.

FIG. 6 shows an IC with a TSV fault-tolerant circuit in accordance with a fifth embodiment of this inventive concept. The IC of FIG. 6 differs from that of FIG. 4 in that a first spare transistor MR1 and a second spare transistor MR2 are further provided at the input and output of the spare TSV TSVR, respectively. In this case, the fourth output of the 2-line-to-4-line decoder may be coupled to control terminals of the first and second spare transistors MR1 and MR2. Table 2 presents a truth table of the decoder of FIG. 6.

TABLE 2

| A | B | TSV1 | TSV2 | TSV3 | TSVR |
|---|---|------|------|------|------|
| 0 | 0 | 1    | 1    | 0    | 1    |
| 0 | 1 | 1    | 0    | 1    | 1    |
| 1 | 0 | 0    | 1    | 1    | 1    |
| 1 | 1 | 1    | 1    | 1    | 1    |

Figure 7:
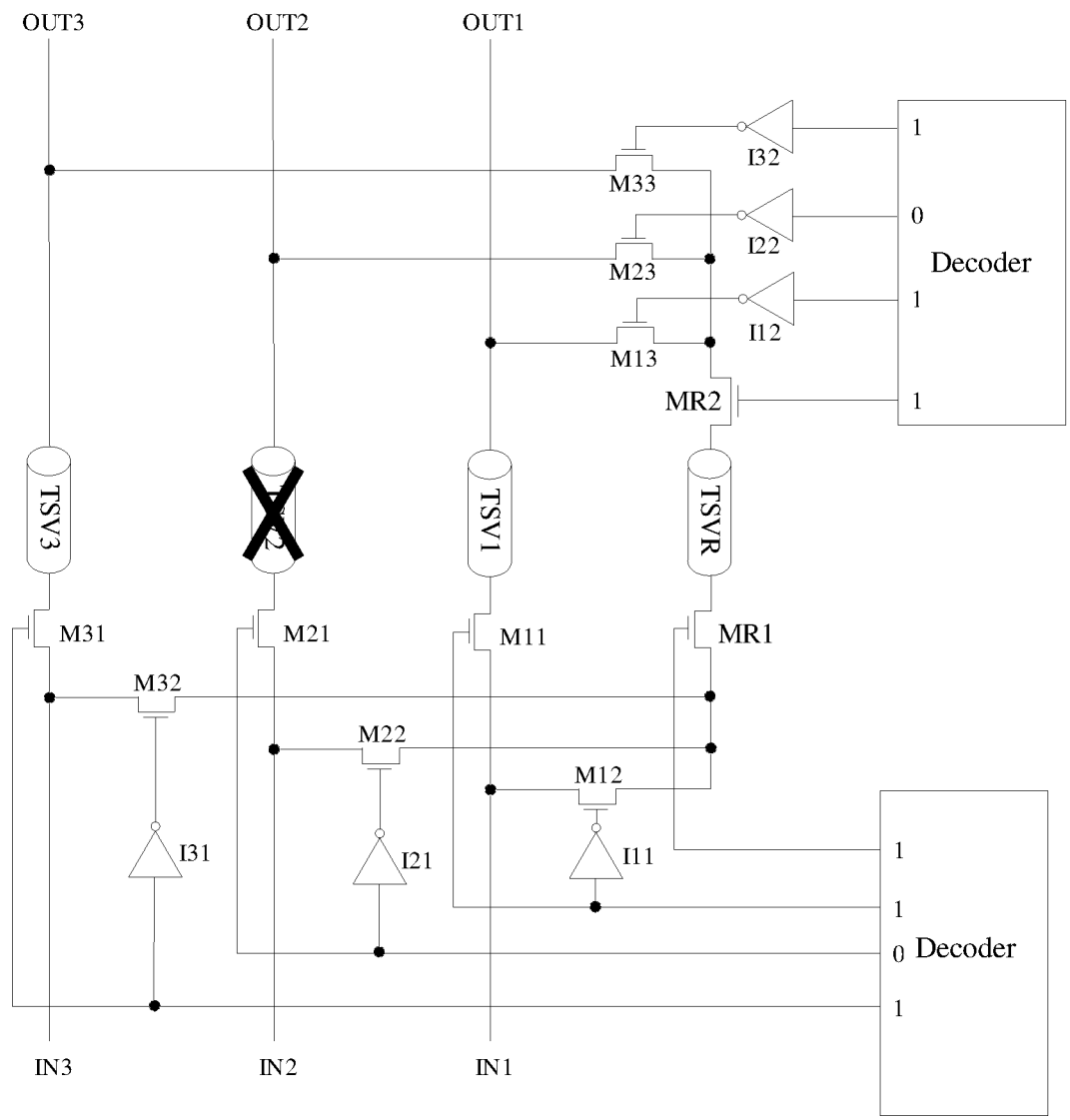
FIG. 7 shows an IC with a TSV fault-tolerant circuit in accordance with a sixth embodiment of this inventive concept.

FIG. 7 shows an IC with a TSV fault-tolerant circuit in accordance with a sixth embodiment of this inventive concept. FIG. 7 shows a scenario of the decoder of FIG. 6, where A=0 and B=1. In this case, a low-level control signal may be provided to the transistor M21 coupled to the input of the active TSV TSV2 to deactivate the active TSV TSV2. Meanwhile, as a result of a high level applied to the control terminal of the first spare transistor MR1, an input IN2 originally intended to pass through the active TSV TSV2 may be switched to the spare TSV TSVR. Moreover, a high level may also be applied to the control terminal of the second spare transistor MR2, so the signal OUT2 output from the spare TSV TSVR may be transmitted to the output of the active TSV TSV2 via the transistor M23.

In the embodiments of FIGS. 2 to 7, each fault-tolerance control module may be implemented as a combination of transistors and inverters, and the transistors may be implemented as NMOS transistors. In light of this inventive concept, those skilled in the art may alternatively use PMOS transistors to implement this inventive concept. In addition, similar functions may also be accomplished with transmission gates, in accordance with this inventive concept.

Alternatively, the aforementioned input control unit may include a first transmission gate, a second transmission gate and a third inverter, wherein the first transmission gate may be configured to deactivate the active TSV based on a positioning code therefor from the decoder. A circuit subunit constituted of the second transmission gate and the third inverter may be configured to activate the spare TSV based on the positioning code for the active TSV from the decoder. Additionally, the aforementioned output control unit may include a third transmission gate and a fourth inverter.

Figure 8:
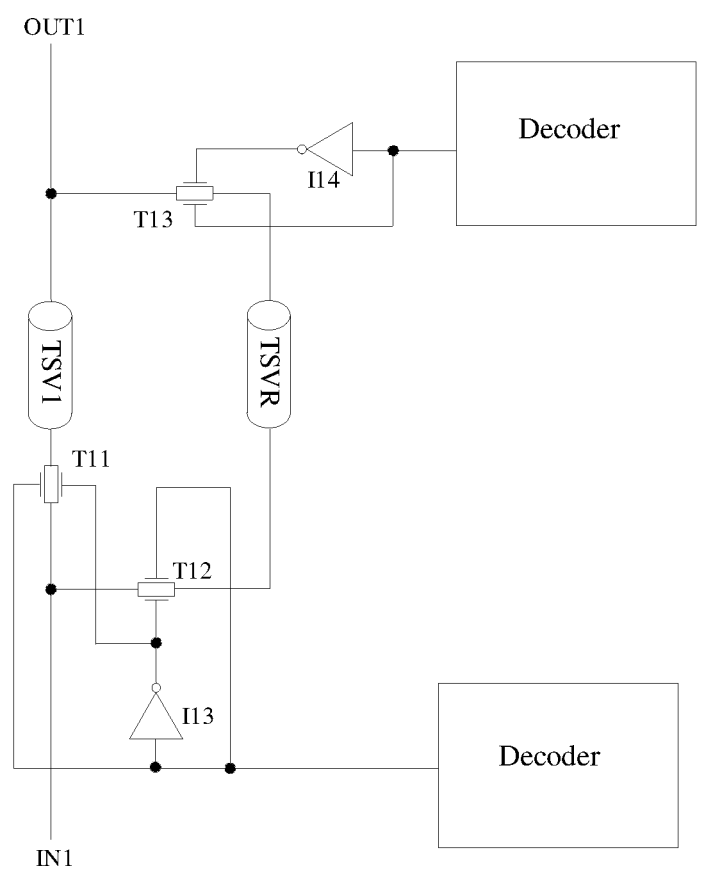
FIG. 8 shows an IC with a TSV fault-tolerant circuit in accordance with a seventh embodiment of this inventive concept.

FIG. 8 shows an IC with a TSV fault-tolerant circuit in accordance with a seventh embodiment of this inventive concept. As illustrated in FIG. 8, according to the seventh embodiment of this inventive concept, the input control unit may include a first transmission gate T11, a second transmission gate T12 and a third inverter I13.

Specifically, the first transmission gate T11 may have a first control terminal coupled to an output of the decoder, a second control terminal of the first transmission gate T11 may be coupled to a second terminal of the third inverter I13, an input of the first transmission gate T11 for receiving a signal IN1 intended to be input to the active TSV TSV1, and an output of the first transmission gate coupled to the input of the active TSV TSV1.

The third inverter I13 may have a first terminal coupled to an output of the decoder, and a second terminal of the third inverter I13 may be coupled to a first control terminal of the second transmission gate T12.

The second transmission gate T12 may additionally have an second control terminal coupled to the output of the decoder, an input of the second transmission gate T12 configured for receiving the signal IN1 to be input to the active TSV TSV1, and an output of the second transmission gate T12 may be coupled to the input of the spare TSV TSVR.

With continued reference to FIG. 8, the output control unit may include a third transmission gate T13 and a fourth inverter I14.

Specifically, the fourth inverter I14 may have a first terminal coupled to the output of the decoder, and a second terminal of the fourth inverter I14 may be coupled to a first control terminal of the third transmission gate T13.

The third transmission gate T13 may further include a second control terminal coupled to the output of the decoder, an input of the third transmission gate T13 may be coupled to the output of the spare TSV TSVR, and an output of the third transmission gate T13 may be coupled to the output of the active TSV TSV1.

For example, when an inspection circuit detects that the active TSV TSV1 has failed, it may issue a command to the decoder, from which the decoder may determine a positioning code for the active TSV TSV1 and send a low-level signal to the active TSV TSV1 via its output coupled thereto. This low-level signal may be received by the first control terminal of the first transmission gate T11 and deactivate the first transmission gate T11. Meanwhile, the first control terminal of the second transmission gate T12 may receive a high-level signal under the action of the third inverter I13, which may turn on the second transmission gate T12, allowing the input IN1 to be switched to the spare TSV TSVR. Additionally, since the decoder may also output a low-level signal through its output coupled to the first terminal of the fourth inverter I14, a high-level signal may be applied to the first terminal of the third transmission gate T13 and may turn on the third transmission gate T13. As a result, the signal that has travelled through the spare TSV TSVR may be fed via the third transmission gate T13, as an output signal OUT1, to the output of the active TSV TSV1.

Figure 9:
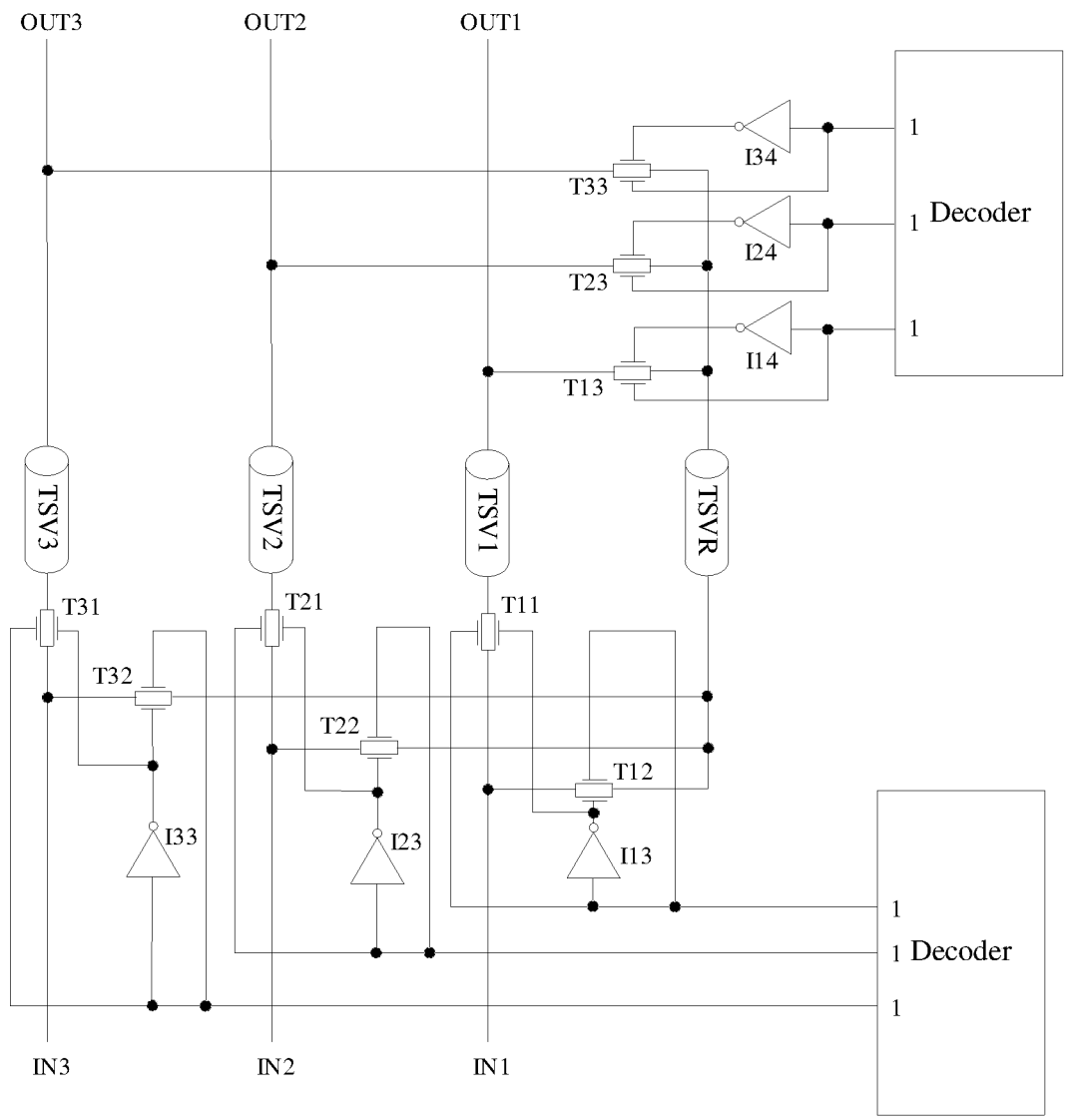
FIG. 9 shows an IC with a TSV fault-tolerant circuit in accordance with an eighth embodiment of this inventive concept.
Figure 10:
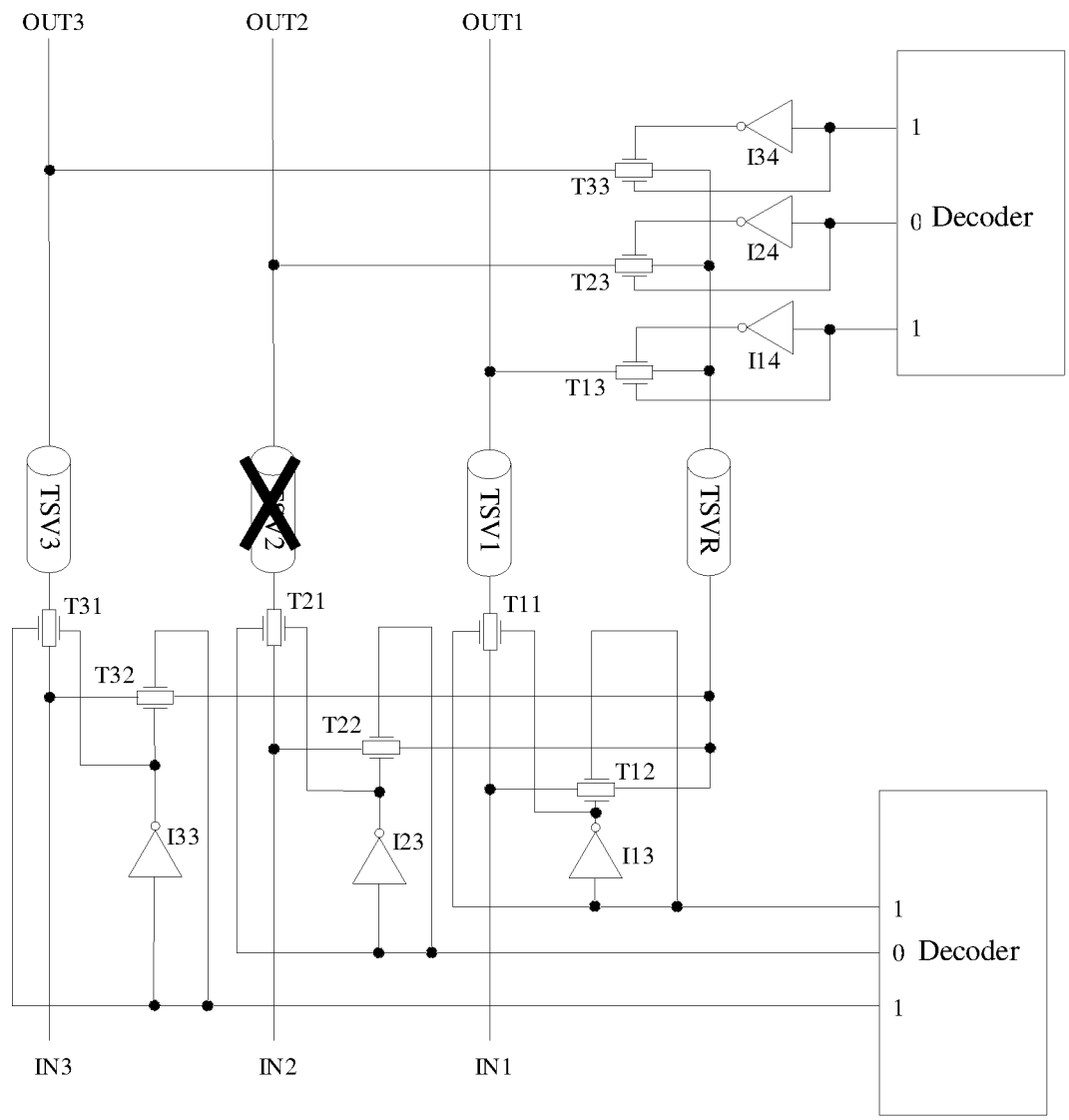
FIG. 10 shows an IC with a TSV fault-tolerant circuit in accordance with a ninth embodiment of this inventive concept.

FIGS. 9 and 10 show embodiments similar to those of FIGS. 6 and 7, with the difference that the fault-tolerance control modules constructed from transistors and inverters in FIGS. 6 and 7 are substituted with those constructed from transmission gates and inverters in FIGS. 9 and 10. Relevant parts in the aforementioned embodiments may be referred to for the connections of these circuit components, which will not be repeatedly described herein.

FIG. 10 shows a scenario of the decoder with the input combination of A=0 and B=1 in the truth table of Table 1. In this case, a low-level signal may be provided to the first control terminal of the transmission gate T21 coupled to the input of the active TSV TSV2. As a result, the transmission gate T21 may be deactivated, disallowing any signal to travel through the active TSV TSV2. On the other hand, the first control terminal of the transmission gate T22 may receive a high-level signal under the action of the inverter I23, bypassing the input IN2 to the spare TSV TSVR via the transmission gate T22. Meanwhile, the first control terminal of the transmission gate T23 may also receive a high-level signal under the action of the inverter I24, which may turn the transmission gate T23 on, allowing the signal output from the spare TSV TSVR to be delivered, as an output signal OUT2, to the output of the active TSV TSV2.

While this inventive concept has been explained above with the embodiments with one or three active TSVs, it will be readily appreciated that this inventive concept may also be applied to other circuits with different numbers of active TSVs.

In summary, in the IC with the TSV fault-tolerant circuit of this inventive concept, upon the failure or malfunctioning of an active TSV, the TSV can be deactivated and a spare TSV may be activated to pass a signal originally intended to be transmitted through the active TSV, thereby achieving TSV fault tolerance. This IC may reduce defect rate in the fabrication of TSV-based 3D IC chips.

Due to the incorporation of the TSV fault-tolerant circuit, this IC may also be fabricated with a significantly reduced defect rate.

This inventive concept further presents a method for TSV fault tolerance, for use with the IC with the TSV fault-tolerant circuit as described above.

Figure 11:
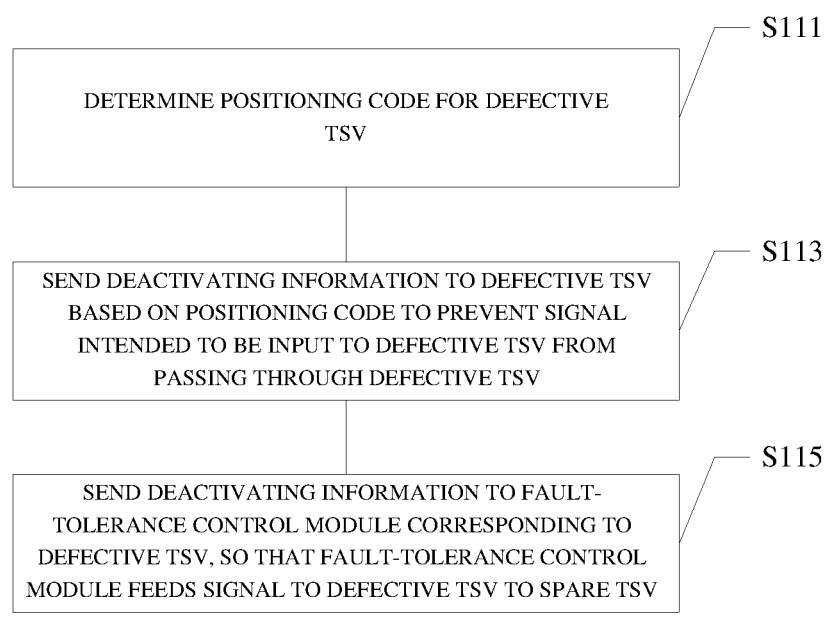
FIG. 11 shows a schematic flowchart illustrating a method for TSV fault tolerance in accordance with one embodiment of this inventive concept.

FIG. 11 is a schematic flowchart illustrating a method for TSV fault tolerance in accordance with one embodiment of this inventive concept. Referring to FIG. 11, the method may include the following steps S111 through S115.

In S111, a positioning code for a defective TSV may be determined.

At first, a TSV inspection device may inspect a number of active TSVs to check whether there is any defective one. Here, the TSV inspection device may be implemented by the aforementioned inspection circuit. Next, upon detection of a defective TSV, the TSV inspection device may send identification information of this defective TSV to a decoder. Here, the identification information may be used to uniquely identify the defective TSV and may be implemented as a combination of A and B input values in one of the above-described truth tables. After that, the decoder may determine, based on the identification information, a positioning code for the defective TSV. Specifically, this may be accomplished by a preconfigured truth table, such as Table 1 described above.

In S113, based on the positioning code, deactivating information may be transmitted to the defective TSV to prevent a signal intended to be input to the defective TSV from passing through the defective TSV.

Specifically, the decoder may transmit the deactivating information to a control terminal of a transistor or transmission gate coupled to an input of the defective TSV to prevent the signal from passing through the defective TSV.

In S115, the deactivating information may be sent to a fault-tolerance control module corresponding to the defective TSV, so that the fault-tolerance control module may feed the signal intended to be input to the defective TSV to a spare TSV.

Specifically, the decoder may send the deactivating information to the aforementioned fault-tolerance control module, which may cause a transistor or transmission gate to be turned on under the action of an inverter, thus allowing the signal intended to be input to the defective TSV to be switched to the spare TSV.

In some embodiments, the method may further include: transmitting, by the decoder, activating information to a transistor or transmission gate coupled to an output of the spare TSV to allow the signal output from the spare TSV to be transmitted to an output of the defective TSV.

The descriptions of the IC with the TSV fault-tolerant circuit in the aforementioned embodiments may be referred to for details in connections among the circuit components and in related processing procedures, which will not be repeatedly described herein.

In the method for TSV fault tolerance of this inventive concept, when the failure or malfunctioning of an active TSV is detected, the TSV may can be deactivated and a spare TSV may be activated to pass a signal originally intended to be transmitted through the active TSV, thereby achieving TSV fault tolerance. This method may reduce the defect rate in the fabrication of TSV-based 3D IC chips.

Other embodiments of this inventive concept will be apparent to those skilled in the art from considering the specification and practicing the invention disclosed herein. Accordingly, this disclosure is intended to cover all and any variations, uses, or adaptations of this inventive concept which follow, in general, the principles thereof and include such departures from this inventive concept come within common knowledge or customary practice within the art to which the invention pertains. It is also intended that the specification and examples be considered as exemplary only, with true scope and spirit of this inventive concept being indicated by the appended claims.

It is to be understood that the present invention is not limited to the exact structures as described above and illustrated in the drawings and may be modified or changed without departing from its scope. The scope of this inventive concept is intended to be defined only by the appended claims.

The invention claimed is:

1. An integrated circuit (IC), comprising:
a plurality of operational TSVs;
a spare TSV;
a plurality of fault-tolerance control modules, each coupled to one of the plurality of operational TSVs and the spare TSV; and
a decoder, coupled to the plurality of fault-tolerance control modules,
wherein the plurality of fault-tolerance control modules are configured to deactivate one of the plurality of operational TSVs that is determined to be defective and activate the spare TSV based on a positioning code for the defective operational TSV from the decoder,
wherein each of the plurality of fault-tolerance control modules comprises:
an input control unit, coupled to an input of one of the plurality of operational TSVs and an input of the spare TSV,
wherein the input control unit is configured to deactivate the operational TSV that is determined to be defective and activate the spare TSV based on the positioning code for the defective operational TSV from the decoder.

2. The integrated circuit of claim 1, wherein the input control unit comprises a first transistor, a second transistor and a first inverter,
the first transistor is configured to deactivate the operational TSV that is determined to be defective based on the positioning code for the defective operational TSV from the decoder, the second transistor and the first inverter are configured to activate the spare TSV based on the positioning code for the defective operational TSV from the decoder.

3. The integrated circuit of claim 1, wherein each of the first transistor and the second transistor comprises a control terminal, a first terminal and a second terminal, and the first inverter comprises a first terminal and a second terminal,
the control terminal of the first transistor is coupled to an output of the decoder, the first terminal of the first transistor is configured to receive a signal intended to be input to the operational TSV, the second terminal of the first transistor is coupled to an input of the operational TSV,
the first terminal of the first inverter is coupled to the output of the decoder, the second terminal of the first inverter is coupled to the control terminal of the second transistor, the first terminal of the second transistor is configured to receive the signal intended to be input to the operational TSV, the second terminal of the second transistor is coupled to the input of the spare TSV.

4. The integrated circuit of claim 1, wherein the input control unit comprises a first transistor, a second transistor, a first inverter and a first spare transistor, the first transistor is configured to deactivate the operational TSV that is determined to be defective based on the positioning code for the defective operational TSV from the decoder, the first spare transistor is configured to activate the spare TSV based on a positioning code for the spare TSV from the decoder, the second transistor and the first inverter are configured to feed a signal intended to be input to the operational TSV that is determined to be defective to the input of the spare TSV based on the positioning code for the defective operational TSV from the decoder.

5. The integrated circuit of claim 4, wherein each of the first transistor, the second transistor and the first spare transistor comprises a control terminal, a first terminal and a second terminal, and the first inverter comprises a first terminal and a second terminal, the control terminal of the first transistor is coupled to a first output of the decoder, the first terminal of the first transistor is configured to receive a signal intended to be input to the operational TSV, the second terminal of the first transistor is coupled to an input of the operational TSV, the first terminal of the first inverter is coupled to the first output of the decoder, the second terminal of the first inverter is coupled to the control terminal of the second transistor, the first terminal of the second transistor is configured to receive the signal intended to be input to the operational TSV, the second terminal of the second transistor is coupled to the first terminal of the first spare transistor, the control terminal of the first spare transistor is coupled to a second output of the decoder, the second terminal of the first spare transistor is coupled to the input of the spare TSV.

6. The integrated circuit of claim 1, wherein each of the plurality of fault-tolerance control modules further comprises:

an output control unit, coupled to an output of the operational TSV and an output of the spare TSV, wherein the output control unit is configured to feed an output signal from the spare TSV to the output of the operational TSV that is determined to be defective based on the positioning code for the defective operational TSV from the decoder.

7. The integrated circuit of claim 6, wherein the output control unit comprises a third transistor and a second inverter, the third transistor comprising a control terminal, a first terminal and a second terminal, the second inverter comprising a first terminal and a second terminal, wherein the first terminal of the second inverter is coupled to an output of the decoder, the second terminal of the second inverter is coupled to the control terminal of the third transistor, the first terminal of the third transistor is coupled to the output of the spare TSV, the second terminal of the third transistor is coupled to the output of the operational TSV.

8. The integrated circuit of claim 6, wherein the output control unit comprises a third transistor, a second inverter and a second spare transistor, each of the third transistor and the second spare transistor comprising a control terminal, a first terminal and a second terminal, the second inverter comprising a first terminal and a second terminal, wherein the first terminal of the second inverter is coupled to a first output of the decoder, the second terminal of the second inverter is coupled to the control terminal of the third transistor, the first terminal of the third transistor is coupled to the first terminal of the second spare transistor, the second terminal of the third transistor is coupled to the output of the operational TSV, the control terminal of the second spare transistor is coupled to a second output of the decoder, the second terminal of the second spare transistor is coupled to the output of the spare TSV.

9. The integrated circuit of claim 6, wherein the output control unit comprises a third transmission gate and a fourth inverter, the third transmission gate comprising a first control terminal, a second control terminal, an input and an output, the fourth inverter comprising a first terminal and a second terminal, wherein the first terminal of the fourth inverter is coupled to the output of the decoder, the second terminal of the fourth inverter is coupled to the first control terminal of the third transmission gate, the second control terminal of the third transmission gate is coupled to the output of the decoder, the input of the third transmission gate is coupled to the output of the spare TSV, the output of the third transmission gate is coupled to the output of the operational TSV.

10. The integrated circuit of claim 1, wherein the input control unit comprises a first transmission gate, a second transmission gate and a third inverter, the first transmission gate is configured to deactivate the operational TSV that is determined to be defective based on the positioning code for the defective operational TSV from the decoder, the second transmission gate and the third inverter are configured to activate the spare TSV based on the positioning code for the defective operational TSV from the decoder.

11. The integrated circuit of claim 10, wherein each of the first transmission gate and the second transmission gate comprises a first control terminal, a second control terminal, an input and an output, and the third inverter comprises a first terminal and a second terminal, the first control terminal of the first transmission gate is coupled to an output of the decoder, the second control terminal of the first transmission gate is coupled to the second terminal of the third inverter, the input of the first transmission gate is configured to receive a signal intended to be input to the operational TSV, the output of the first transmission gate is coupled to an input of the operational TSV, the first terminal of the third inverter is coupled to the output of the decoder, the second terminal of the third inverter is coupled to the first control terminal of the second transmission gate, the second control terminal of the second transmission gate is coupled to the output of the decoder, the input of the second transmission gate is configured to receive the signal intended to be input to the operational TSV, the output of the second transmission gate is coupled to the input of the spare TSV.

12. The integrated circuit of claim 1, wherein a number of operational TSVs is no less than 4.

13. The integrated circuit of claim 1, wherein a number of operational TSVs is 4, 8, 16, 32, or 64.

14. The integrated circuit of claim 1, wherein the positioning code for the defective operational TSV is 0, and a positioning code for a normal operational TSV is 1.

* * * * *